(12) United States Patent
Ju

(10) Patent No.: US 7,137,840 B1
(45) Date of Patent: Nov. 21, 2006

(54) FASTENING STRUCTURE AND AN ELECTRICAL CONNECTOR USING THE FASTENING STRUCTURE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/387,798

(22) Filed: Mar. 24, 2006

(51) Int. Cl.
*H01R 13/62* (2006.01)

(52) U.S. Cl. ................................ 439/330; 439/331

(58) Field of Classification Search ............... 439/330, 439/331
See application file for complete search history.

(56) References Cited

U.S. PATENT DOCUMENTS

| | | | | |
|---|---|---|---|---|
| 4,502,747 A | * | 3/1985 | Bright et al. ............... | 439/296 |
| 4,560,216 A | * | 12/1985 | Egawa ........................ | 439/41 |
| 4,940,432 A | * | 7/1990 | Consoli et al. ............. | 439/862 |
| 5,213,531 A | * | 5/1993 | Matsuoka et al. .......... | 439/331 |
| 5,320,550 A | * | 6/1994 | Uratsuji et al. ............. | 439/266 |
| 5,326,271 A | * | 7/1994 | Kishi et al. ................. | 439/72 |
| 5,407,361 A | * | 4/1995 | Ikeya ........................... | 439/72 |
| 6,439,910 B1 | * | 8/2002 | Hayakawa ................... | 439/266 |
| 6,991,474 B1 | * | 1/2006 | Ju ................................ | 439/73 |

* cited by examiner

*Primary Examiner*—Tulsidas C. Patel
*Assistant Examiner*—Vladimir Imas
(74) *Attorney, Agent, or Firm*—Rosenberg, Klein & Lee

(57) ABSTRACT

A fastening structure and an electrical connector using the fastening structure are provided. The fastening structure includes an upper rod and a lower rod. The rods individually include an axle center part, a pressing part, and an operating part. When the operating part of the upper rod is moved downward, it also makes the operating part of the lower rod move downward. Therefore, the pressing parts of the upper and lower rods both press on the second object. An electrical connector using the fastening structure is used for connecting a chip module. The electrical connector includes an insulation body, a plurality of conductive pins, and a fastening structure. The pressing parts of the upper and lower rods both press on the chip module for effectively preventing the chip module from being warped when the chip module is fastened. The function of the electrical connector is guaranteed.

10 Claims, 5 Drawing Sheets

US 7,137,840 B1

FASTENING STRUCTURE AND AN ELECTRICAL CONNECTOR USING THE FASTENING STRUCTURE

BACKGROUND OF THE INVENTION

1. Field of the Invention

The present invention relates to a fastening structure and an electrical connector using the fastening structure.

2. Description of the Related Art

Please refer to FIGS. 1, 2 and 3, which show an electrical connector of the prior art. The electrical connector is used for connecting a chip module 500 to a circuit board 600. The electrical connector includes an upper metal shell 100 and a base 200 that are movably connected together, and a rod 300 that is used for fixing the upper metal shell 100 with the base 200. The chip module 500 is placed on the base 200 and the upper metal shell 100 is rotated to make the upper metal shell 100 press the chip module 500. Then, the rod 300 is rotated to make a pressing part 301 of the rod 300 press on the upper metal shell 100, and an operating part 302 of the rod 300 is fastened to a tongue-shaped flake 201 of the base 200. Thereby, the chip module 500 is firmly fastened to the electrical connector. However, when the rod 300 is rotated to make the upper metal shell 100 press on the chip module 500, the chip module 500 is easily warped. Therefore, the electrical connector is damaged and cannot work normally.

SUMMARY OF THE INVENTION

One particular aspect of the present invention is to provide a fastening structure and an electrical connector using the fastening structure. The fastening structure is used for connecting the chip module and effectively prevents the chip module from being warped when the chip module is fastened. The function of the electrical connector is guaranteed.

The fastening structure of the present invention is used for fixing a first object to a second object. The fastening structure includes an upper rod and a lower rod that are located opposite to each other. The rods individually include an axle center part pivoted on the first object, a pressing part rotating with the axle center part, and an operating part. When the operating part of the upper rod is moved downward, it also makes the operating part of the lower rod move downward. Therefore, the pressing parts of the upper rod and the lower rod both press on the second object. An electrical connector using the fastening structure is used for connecting with a chip module. The electrical connector includes an insulation body, a plurality of conductive pins received in the insulation body, and a fastening structure pivoted on the insulation body. The fastening structure includes an upper rod and a lower rod that are located at opposite locations. The rods individually include an axle center part pivoted on the insulation body, a pressing part rotating with the axle center part, and an operating part. When the operating part of the upper rod is moved downward, it also makes the operating part of the lower rod move downward. Therefore, the pressing parts of the upper rod and the lower rod both press on the chip module.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
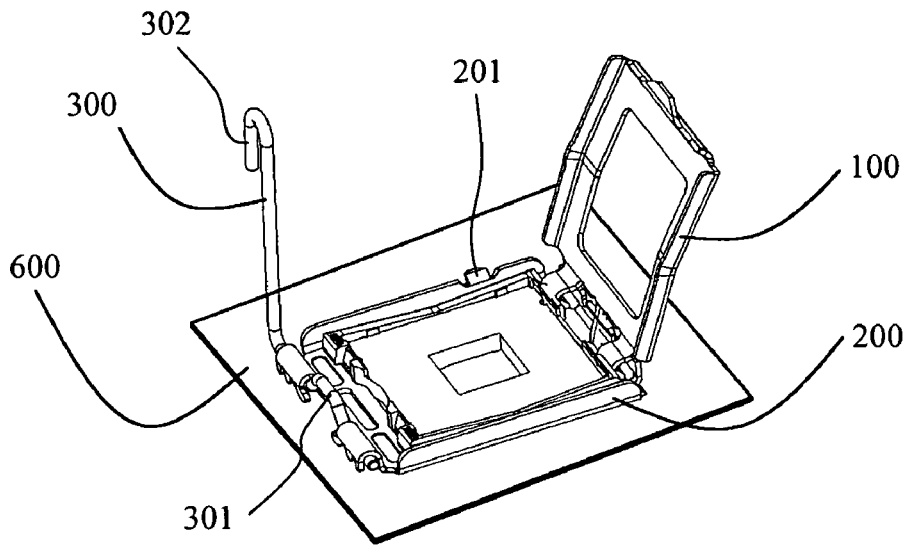
FIG. 1 is a perspective view of the electrical connector of the prior art.
Figure 2:
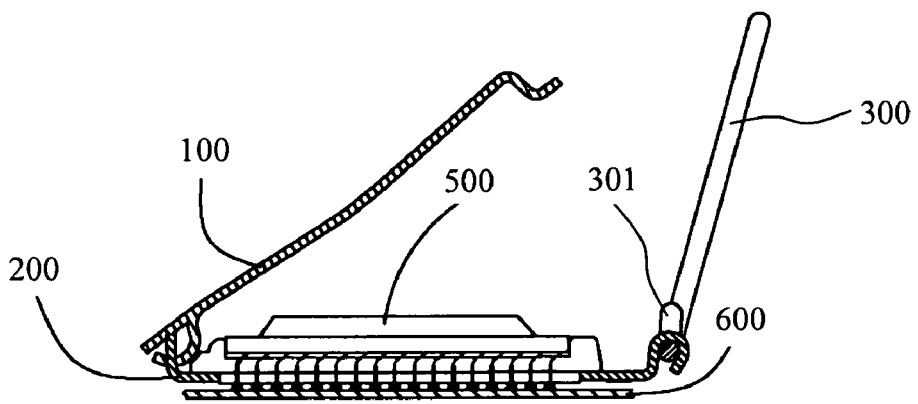
FIG. 2 is a cross-sectional view of the electrical connector of the prior art.
Figure 3:
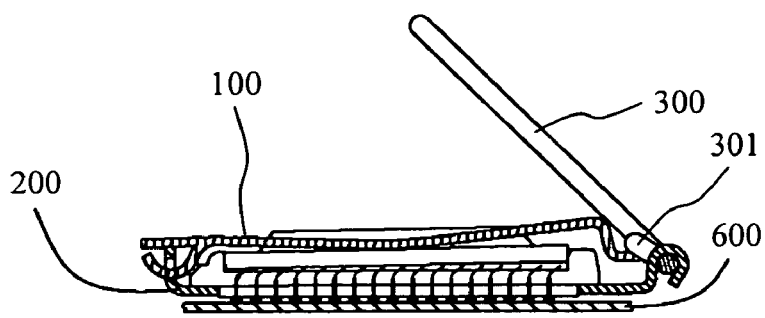
FIG. 3 is a schematic view of a rod of the electrical connector of the prior art pressing on the chip module.
Figure 4:
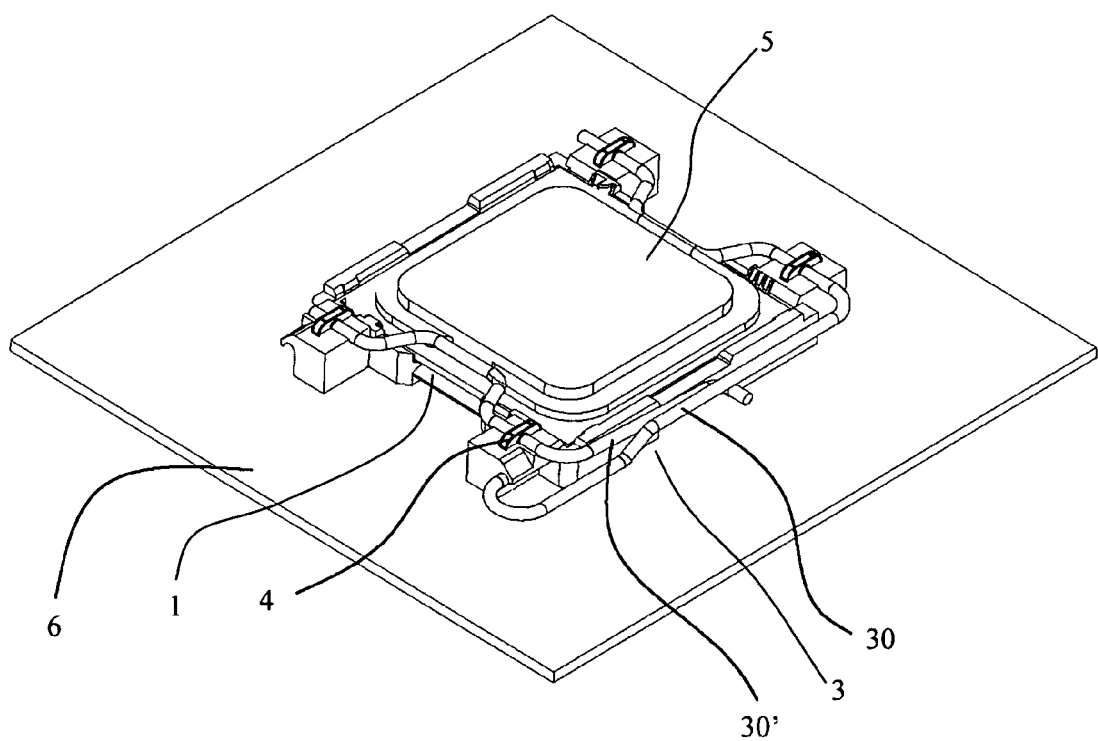
FIG. 4 is a perspective view of the electrical connector of the present invention being closed.

Please refer to FIGS. 4, 5, 6 and 7. The present invention provides a fastening structure and an electrical connector using the fastening structure. The electrical connector includes an insulation body 1, a plurality of conductive pins 2, a fastening structure 3 and a plurality of metal fastening flakes 4. The fastening structure 3 fastens a plate grid array chip module 5, and the chip module 5 is electrically connected to a circuit board 6.

Figures 5, 5A:
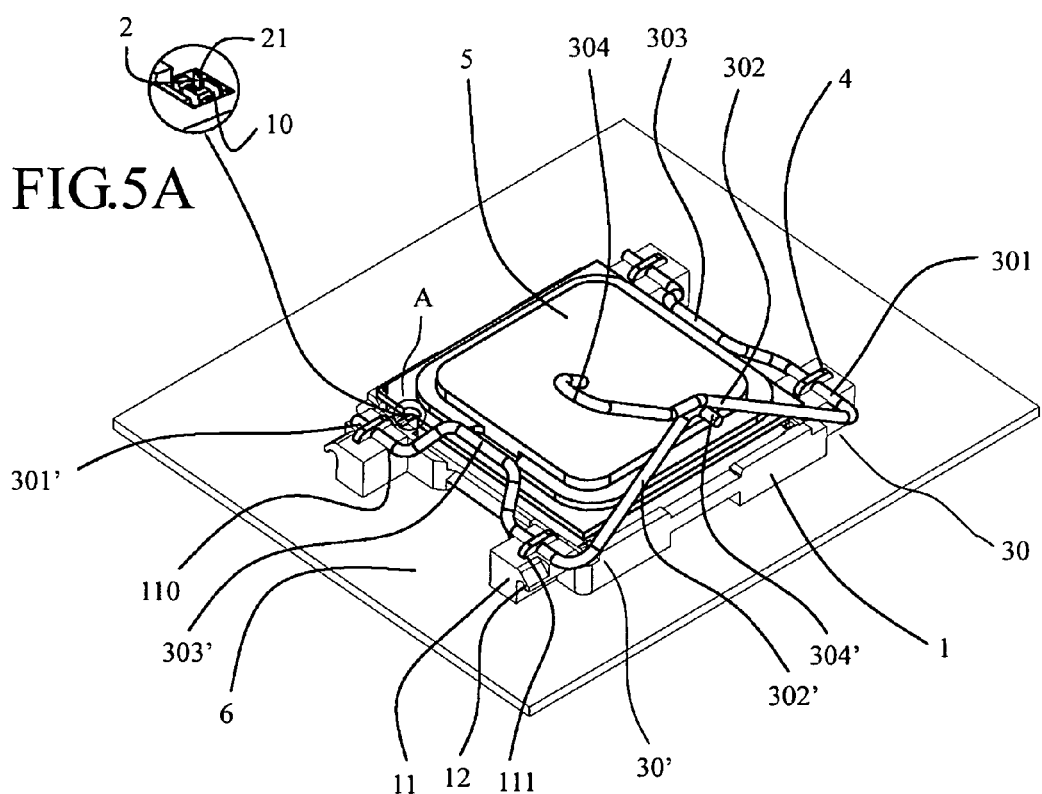
FIG. 5 is a perspective view of the electrical connector of the present invention being opened.
FIG. 5A is a detail view of part A in the FIG. 5.
Figure 6:
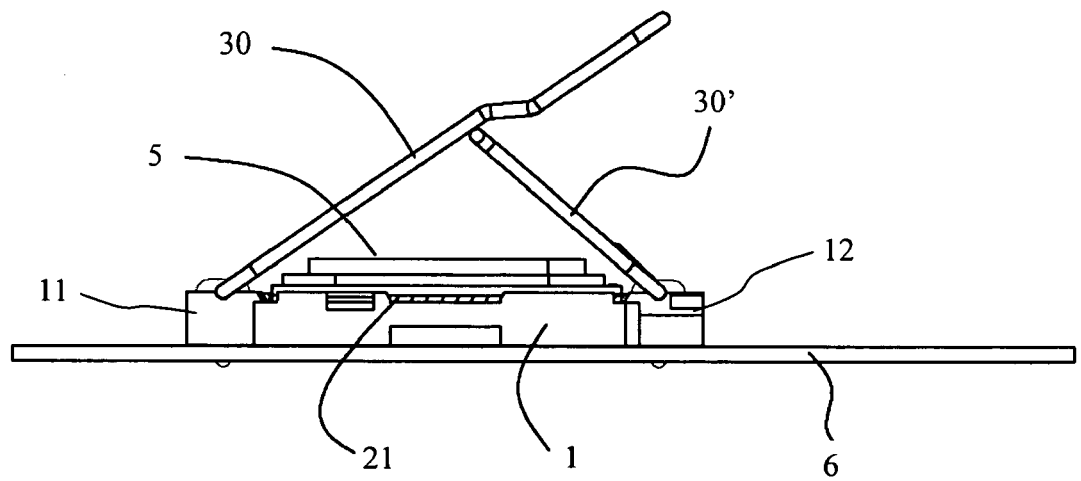
FIG. 6 is a side view of the electrical connector of the present invention being opened.
Figure 7:
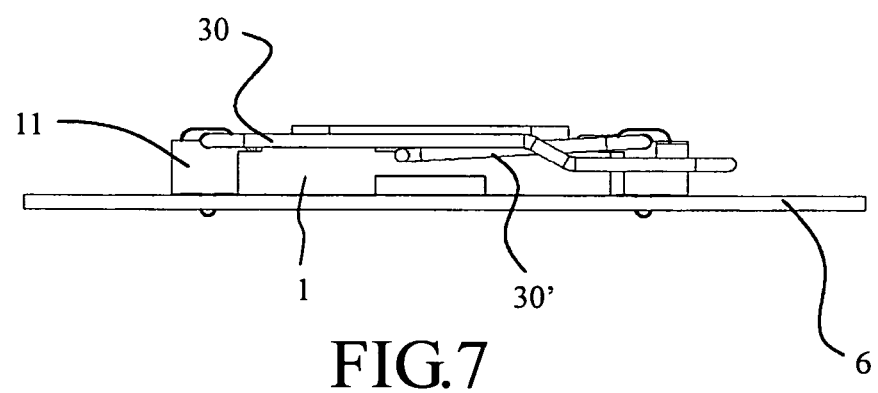
FIG. 7 is a side view of the electrical connector of the present invention being closed.

The insulation body 1 has a plurality of receiving holes 10, and a plurality of positioning side blocks 111 are formed around the receiving holes 10 and are higher than the receiving holes 10. The conductive pins 2 are received in the receiving holes 10 (as shown in FIG. 5A). At least one end of the conductive pins 2 is higher than the receiving holes 10 and is bent to form a plurality of contacting point 21. The highest point of the conductive pins 2 is lower than an upper surface of the positioning side blocks 11 and the lower end (not shown in the figure) of the conductive pins 2 is electrically connected with the circuit board 6. On the upper surface of the positioning side blocks 11, there are a plurality of receiving slots 110. The receiving slots 110 have a plurality of opening slot 111 that are vertical to and pass through the upper and lower surface of the insulation body 1. The opening slot 111 receives the metal fastening flakes 4. Moreover, two positioning side blocks 11 of the insulation body 1 each have a hooking part 12 that faces toward the outside.

Figure 8:
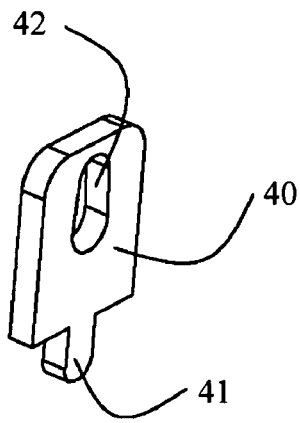
FIG. 8 is a perspective view of a metal fastening flake of the electrical connector of the present invention.

Please refer to FIG. 8. The metal fastening flakes 4 have a flaked shape and include a holding part 40 and a welding part 41 extending downward and vertically from the holding part 40. The holding part 40 has a through hole 42 that can be passed through the axle center part 301 and 301' of the upper rod 30 or the lower rod 30' of the fastening structure 3. The welding part 41 extends outside to the lower surface of the insulation 40 and is connected with the circuit board 6.

The fastening structure 3 includes an upper rod 30 and a lower rod 30'. The upper rod 30 and the lower rod 30' individually include axle center parts 301 and 301', operating parts 302 and 302' that are roughly vertical to the axle center parts 301 and 301', and pressing parts 303 and 303' that are extended from the middle of the axle center parts 301 and 301' and facing inwards. The axle center part3 301 and 301' are received in the receiving slots 111 of the insulation body 1. The through hole 42 of the metal fastening flake 4 restricts the vertical displacement of the axle center parts 301 and 301'. Therefore, the upper rod 30 and the lower rod 30' are firmly pivoted with the insulation body 1. On the one end of the operating part 302' of the lower rod 30' that is far away from the axle center part 301', there is a pressing part 304' that is roughly vertical to the operating part 302'. On one end of the operating part 302 of the upper rod 30 that is far away from the axle center part 301, there is a hooking hold part 304 that hooks and holds with the hooking part 12. The operating part 302 of the upper rod 30 is located on the operating part 302' of the lower rod 30'. When the operating part 302 is rotated, it makes the operating part 302 of the upper rod 30 press downward to the pressing part 304' of the lower rod 30' and makes the operating part 302' of the lower rod 30' also move downward, thereby the pressing part 303' is moved. Therefore, the pressing part303' and the pressing part 303 of the upper rod both press on the chip module 5. When the rods reach the end location, the end of the hooking hold part 304 hooks and fastens under the hooking part 12 of the insulation body 1. Therefore, the chip module 5 is fastened to the insulation body 1 and the conductive pins 2 are electrically connected with the chip module 5.

The upper rod 30 and the lower rod 30' are located at an opposite location of the insulation body 1 (the first object). When the electrical connector is connected with the chip module 5 (the second object), it only needs to place the chip module 5 on the insulation body 1 and makes the pressing part 303 and 303' of the upper rod 30 and the lower rod 30' individually press on an upper surface of two opposite sides of the chip module 5. Next, the operating part 302 is rotated to make the upper rod 30 and the lower rod 30' press the chip module 5 at the same time. Therefore, the chip module 5 will not be warped and the pins of the electrical connector will not be damaged. The operation of the electrical connector is guaranteed.

Figure 9:
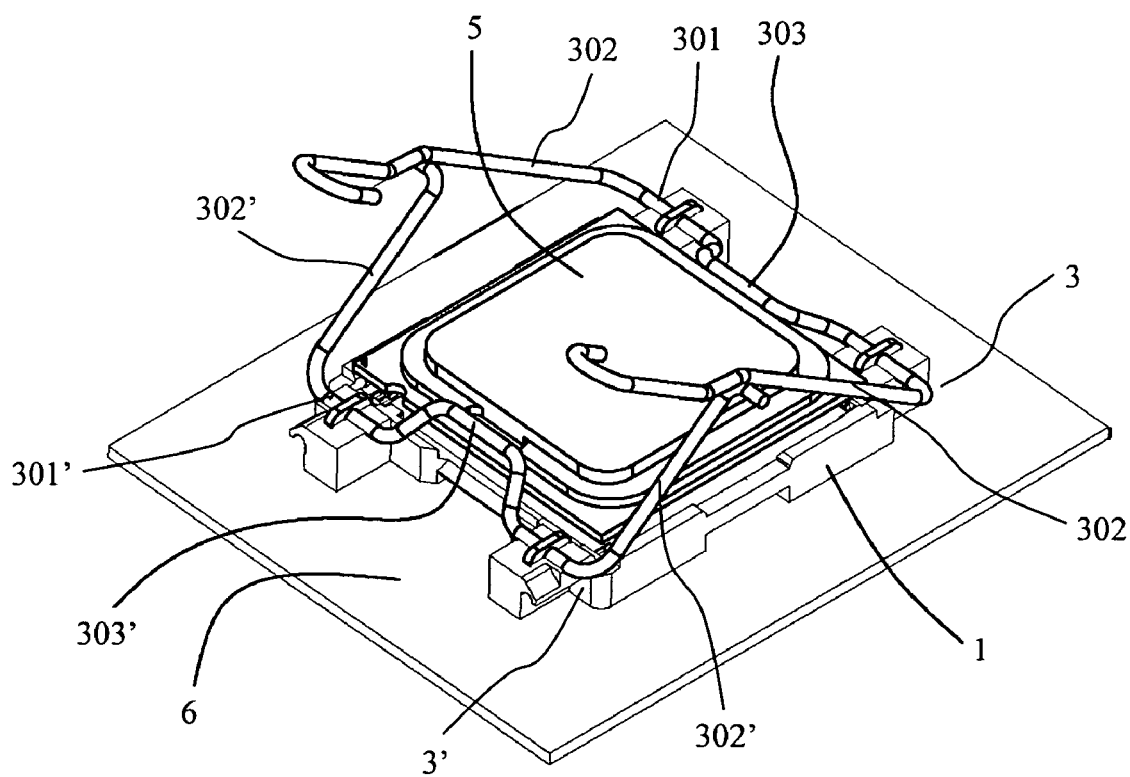
FIG. 9 is a perspective view of the electrical connector of another embodiment of the present invention.

In another embodiment, both the upper rod 30 and the lower rod 30' have two operating parts 302 and 302' that are located on the two sides of the axle center part 301 and 301' (as shown in FIG. 9). It achieves the same function as previous one.

Of course, another embodiment can also adopts another type to fasten the upper rod 30 and the lower rod 30' to the insulation body 1 without the metal fastening flake 4. For example, there are pivoting holes or pivoting slots directly passing through the positioning side block 11 of the insulation body 1 for pivoting the axle center parts 301 and 301' of the upper rod 30 and the lower rod 30' with the insulation body 1 (not shown in the figure). It also achieves the same function as the previous embodiments.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A fastening structure, used for fixing a first object to a second object, wherein the fastening structure includes an upper rod and a lower rod located at opposite locations, the rods individually include an axle center part pivoted on the first object, a pressing part rotating with the axle center part, and an operating part, when the operating part of the upper rod is moved downward, it also makes the operating part of the lower rod move downward, and the pressing parts of the upper rod and the lower rod both press on the second object.

2. The fastening structure as claimed in claim 1, wherein the operating part is located at one end of the axle center part and is vertical to the axle center part, and the pressing part is located at the middle of the axle center part and extends inwards.

3. The fastening structure as claimed in claim 1, wherein one end of the operating part of the lower rod that is far away from the axle center part has a pressing part that is vertical to the operating part and can be pressed by the operating part of the upper rod, and one end of the operating part of the upper rod that is far away from the axle center part has a hooking part that is fastened with the first object.

4. The fastening structure as claimed in claim 1, wherein both the upper rod and the lower rod have two operating parts, and the two operating parts are located at two sides of the axle center part.

5. An electrical connector, used for connecting a chip module, wherein the electrical connector includes an insulation body, a plurality of conductive pins received in the insulation body, and a fastening structure pivoted on the insulation body, the fastening structure includes an upper rod and a lower rod located at an opposite location, and the rods each include an axle center part pivoted on the insulation body, a pressing part rotating with the axle center part, and an operating part, when the operating part of the upper rod is moved downward, it also makes the operating part of the lower rod move downward and the pressing parts of the upper rod and the lower rod both press on the chip module.

6. The electrical connector as claimed in claim 5, wherein the insulation body is pivoted with the upper rod and the lower rod via a plurality of metal fastening flakes, and each of the metal fastening flakes has a through hole and the axle center parts of the upper rod and the lower rod pass through the through hole.

7. The electrical connector as claimed in claim 5, wherein the operating part is located at one end of the axle center part and is vertical to the axle center part, and the pressing part is located at the middle of the axle center part and extends inwards.

8. The electrical connector as claimed in claim 5, wherein one end of the operating part of the lower rod that is far away from the axle center part has a pressing part that is vertical to the operating part and can be pressed by the operating part of the upper rod.

9. The electrical connector as claimed in claim 5, wherein insulation body includes a positioning side block and outside of the positioning side block there is a hooking hold part, and one end of the operating part of the upper rod that is far away from the axle center part has a hooking part that hooks and holds with the hooking hold part.

10. The electrical connector as claimed in claim 5, wherein both the upper rod and the lower rod have two operating parts, and the two operating parts are located at two sides of the axle center part.

* * * * *